United States Patent
Yang

(10) Patent No.: US 10,897,670 B1
(45) Date of Patent: Jan. 19, 2021

(54) EXCURSION AND THERMAL MANAGEMENT FOR AUDIO OUTPUT DEVICES

(71) Applicant: Amazon Technologies, Inc., Seattle, WA (US)

(72) Inventor: Jun Yang, San Jose, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/176,849

(22) Filed: Oct. 31, 2018

(51) Int. Cl.
| | | |
|---|---|---|
| *H04R 3/00* | (2006.01) | |
| *H04R 3/04* | (2006.01) | |
| *H04R 29/00* | (2006.01) | |
| *H04R 9/06* | (2006.01) | |
| *H03G 7/00* | (2006.01) | |
| *H04R 1/02* | (2006.01) | |

(52) U.S. Cl.
CPC .............. *H04R 3/007* (2013.01); *H04R 3/04* (2013.01); *H04R 29/001* (2013.01); *H03G 7/002* (2013.01); *H04R 1/025* (2013.01); *H04R 3/005* (2013.01); *H04R 9/06* (2013.01); *H04R 29/003* (2013.01); *H04R 2430/01* (2013.01)

(58) Field of Classification Search
CPC ........ H04R 3/007; H04R 3/04; H04R 29/001; H04R 9/06; H04R 2430/01; H04R 1/025; H04R 3/003; H04R 29/003; H04R 2499/11; H03G 7/002
See application file for complete search history.

(56) References Cited

U.S. PATENT DOCUMENTS

| | | | | |
|---|---|---|---|---|
| 4,583,245 A | * | 4/1986 | Gelow | H04R 3/14 381/100 |
| 6,865,274 B1 | * | 3/2005 | Aarts | H04R 3/007 381/55 |
| 2002/0118841 A1 | * | 8/2002 | Button | G01K 7/427 381/55 |
| 2012/0281844 A1 | * | 11/2012 | Luo | H03F 1/52 381/55 |
| 2013/0259245 A1 | * | 10/2013 | Cheng | H04R 3/00 381/58 |
| 2016/0157014 A1 | * | 6/2016 | Van Schyndel | H04R 3/007 381/55 |
| 2016/0249135 A1 | * | 8/2016 | Savvopoulos | H04R 3/007 |
| 2016/0309255 A1 | * | 10/2016 | Marcone | H04R 3/007 |
| 2018/0014121 A1 | * | 1/2018 | Lawrence | H04R 3/007 |
| 2018/0213322 A1 | * | 7/2018 | Napoli | H04R 3/007 |
| 2019/0281385 A1 | * | 9/2019 | Brunet | H04R 3/007 |

* cited by examiner

*Primary Examiner* — Davetta W Goins
*Assistant Examiner* — Kuassi A Ganmavo
(74) *Attorney, Agent, or Firm* — Pierce Atwood LLP

(57) ABSTRACT

A system manages temperature and excursion effects on a loudspeaker. Data corresponding to a temperature of the loudspeaker and data corresponding to an excursion (i.e., displacement) of a membrane of the loudspeaker are determined. The dynamic ranges of the temperature and excursion data are compressed, combined, and smoothed. This smoothed data is multiplied with a delayed version of audio data; peak values of the result may be limited. This operation may be performed on multiple frequency bands of audio data. The final output data is combined to form a full-band signal and sent to a loudspeaker.

18 Claims, 15 Drawing Sheets

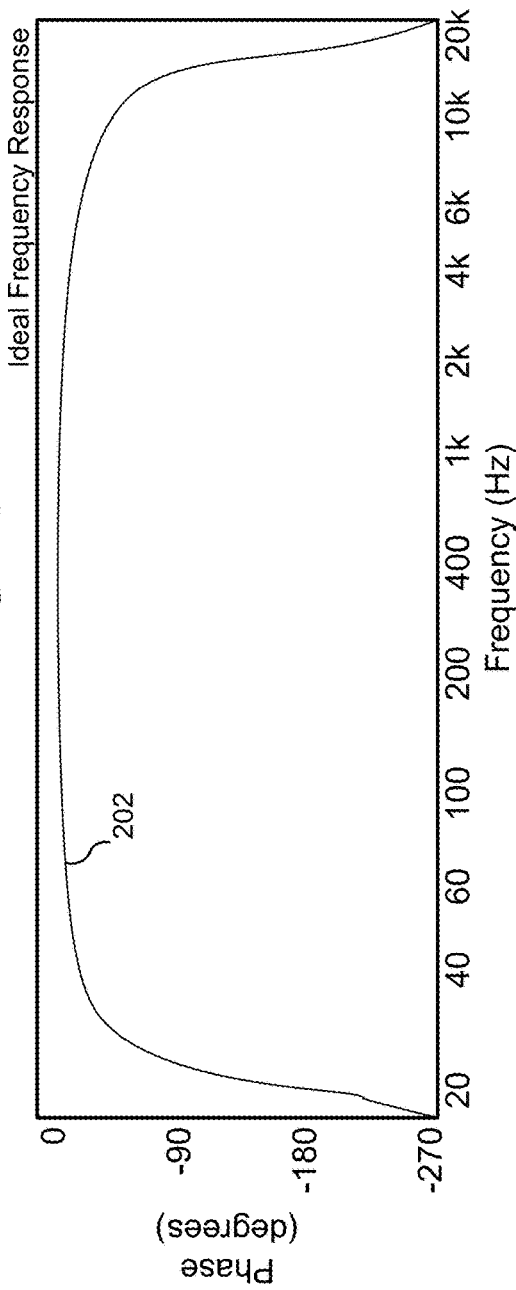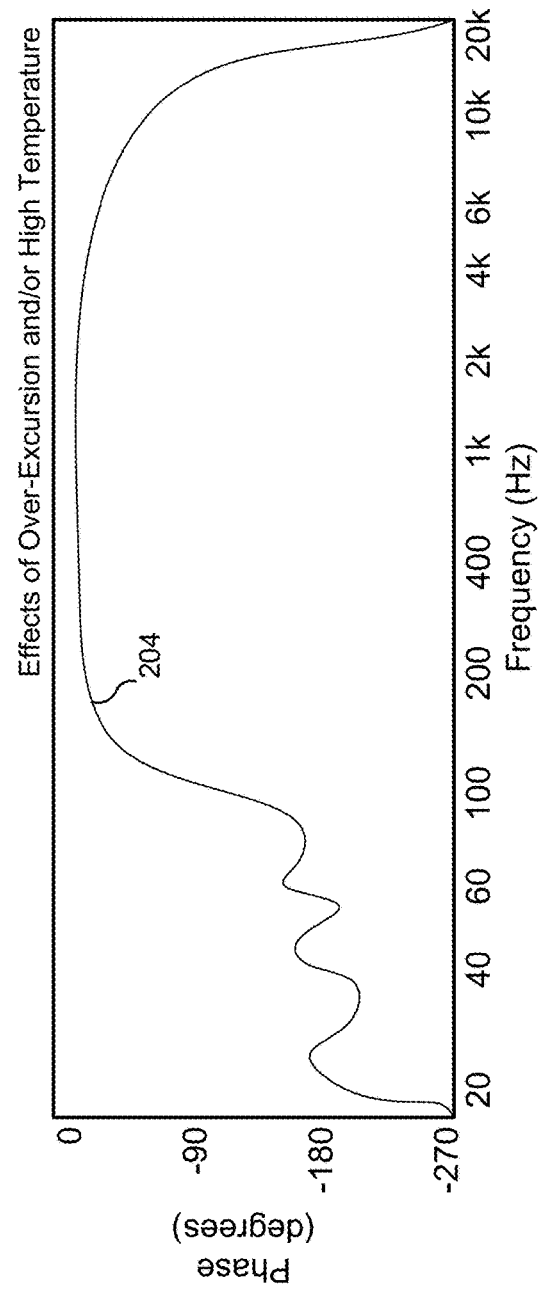

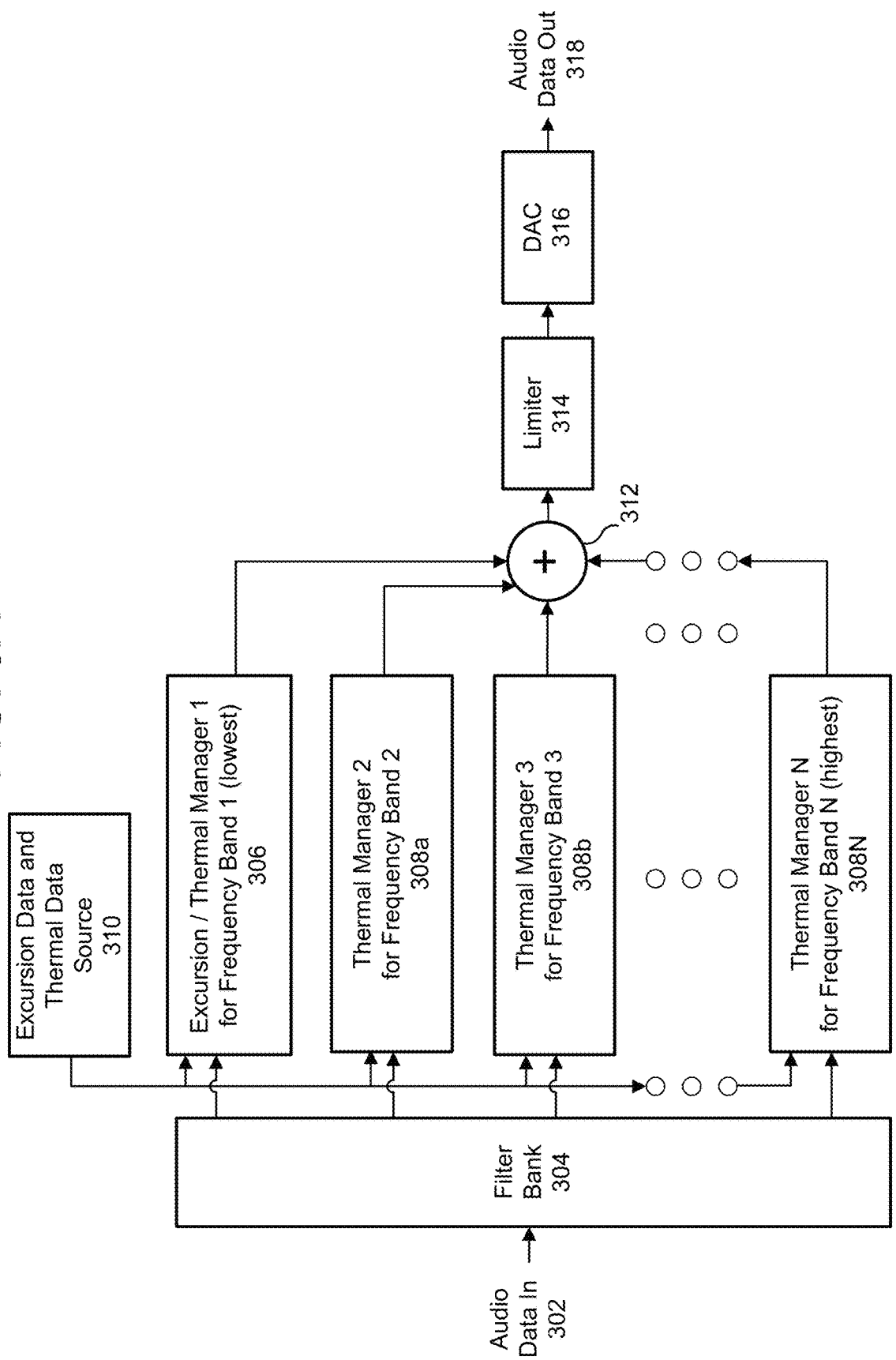

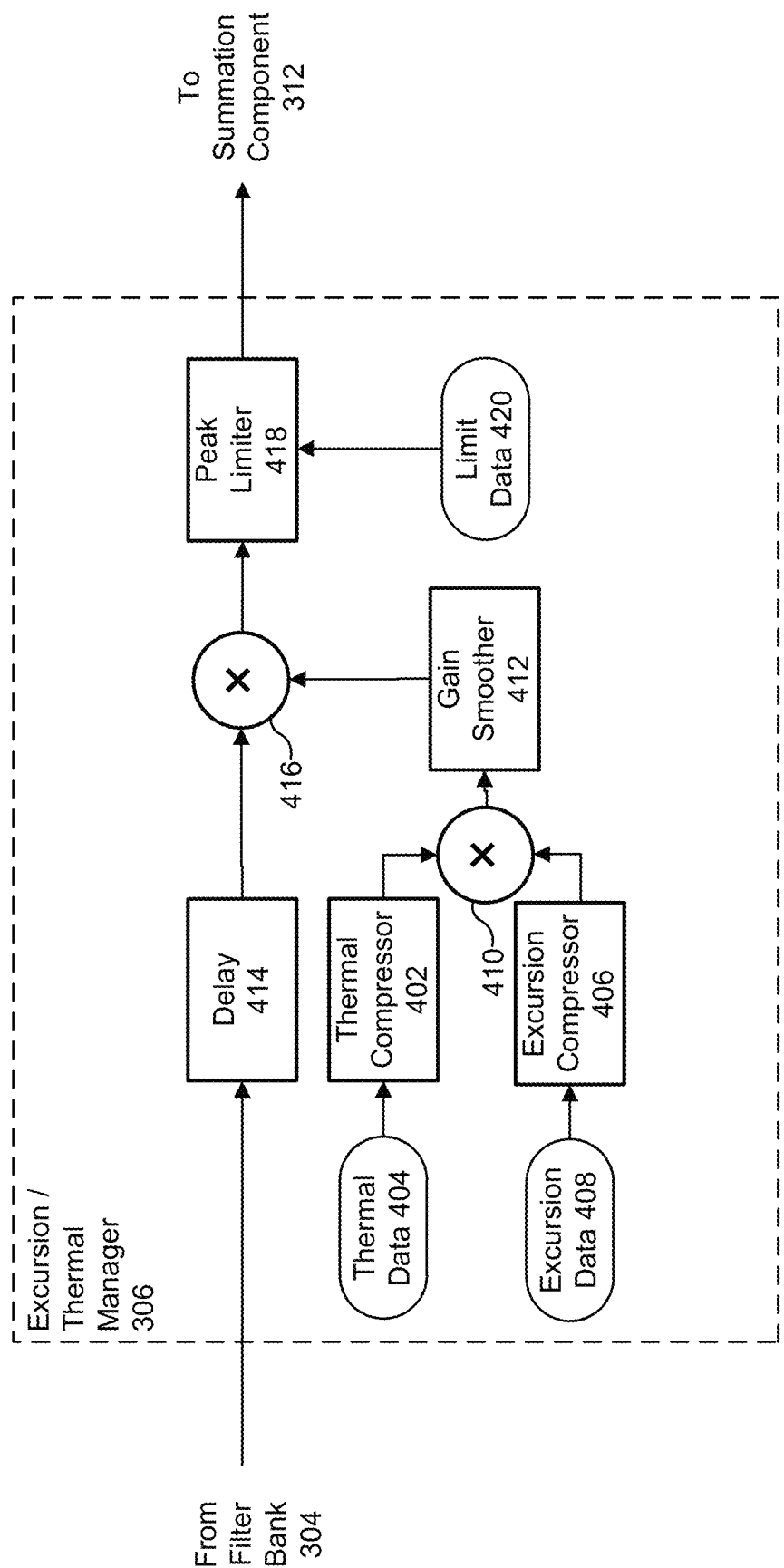

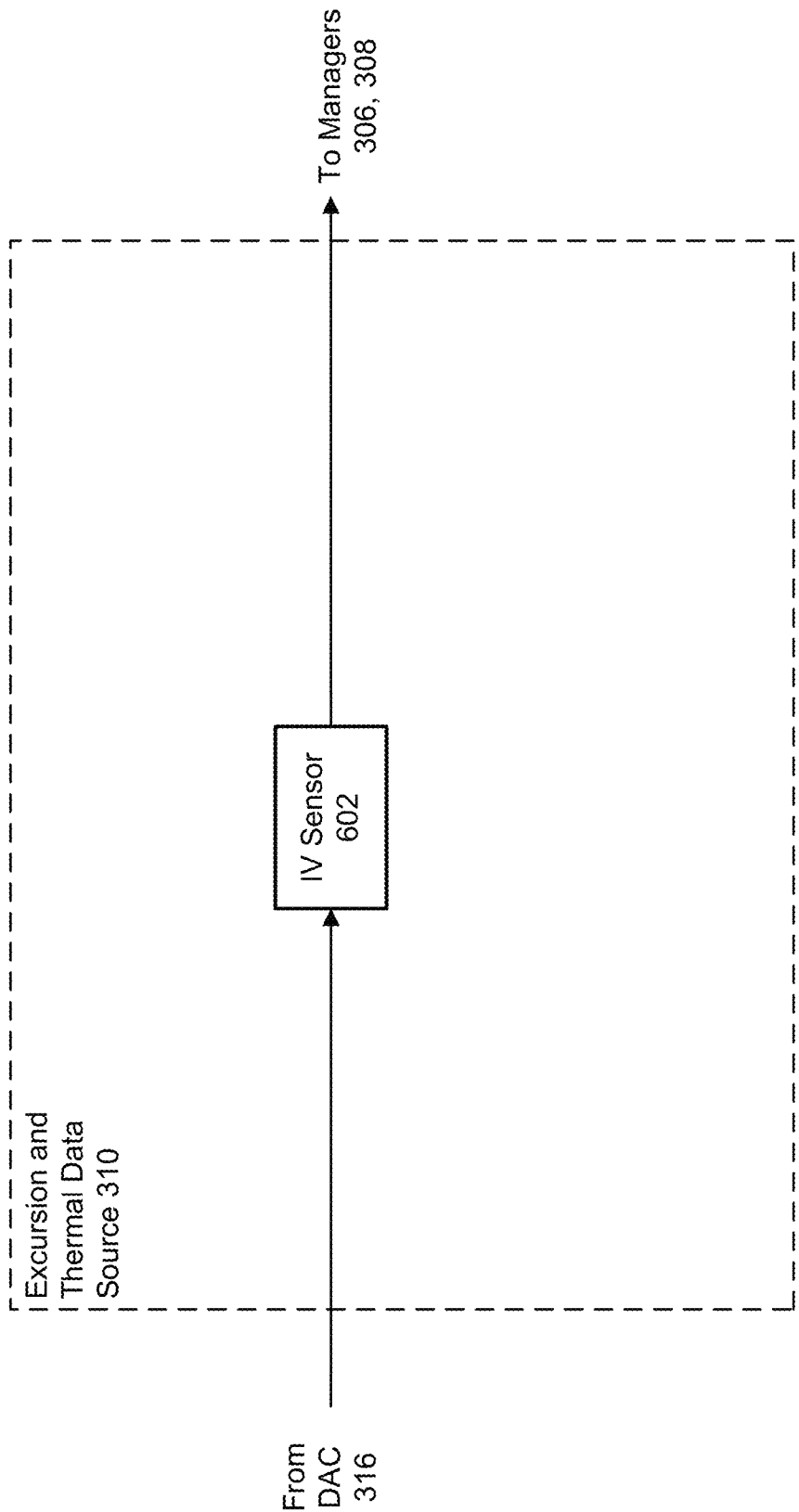

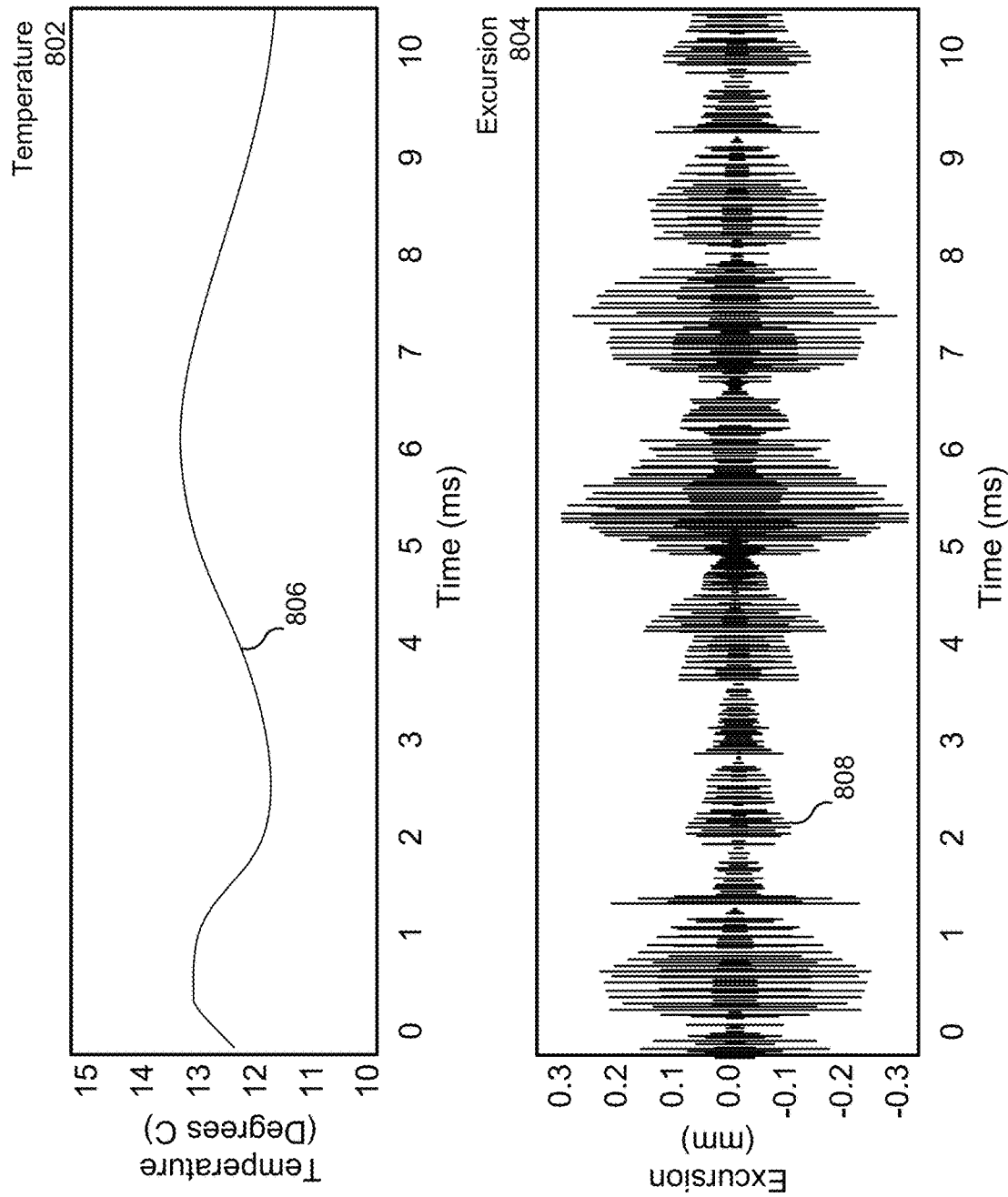

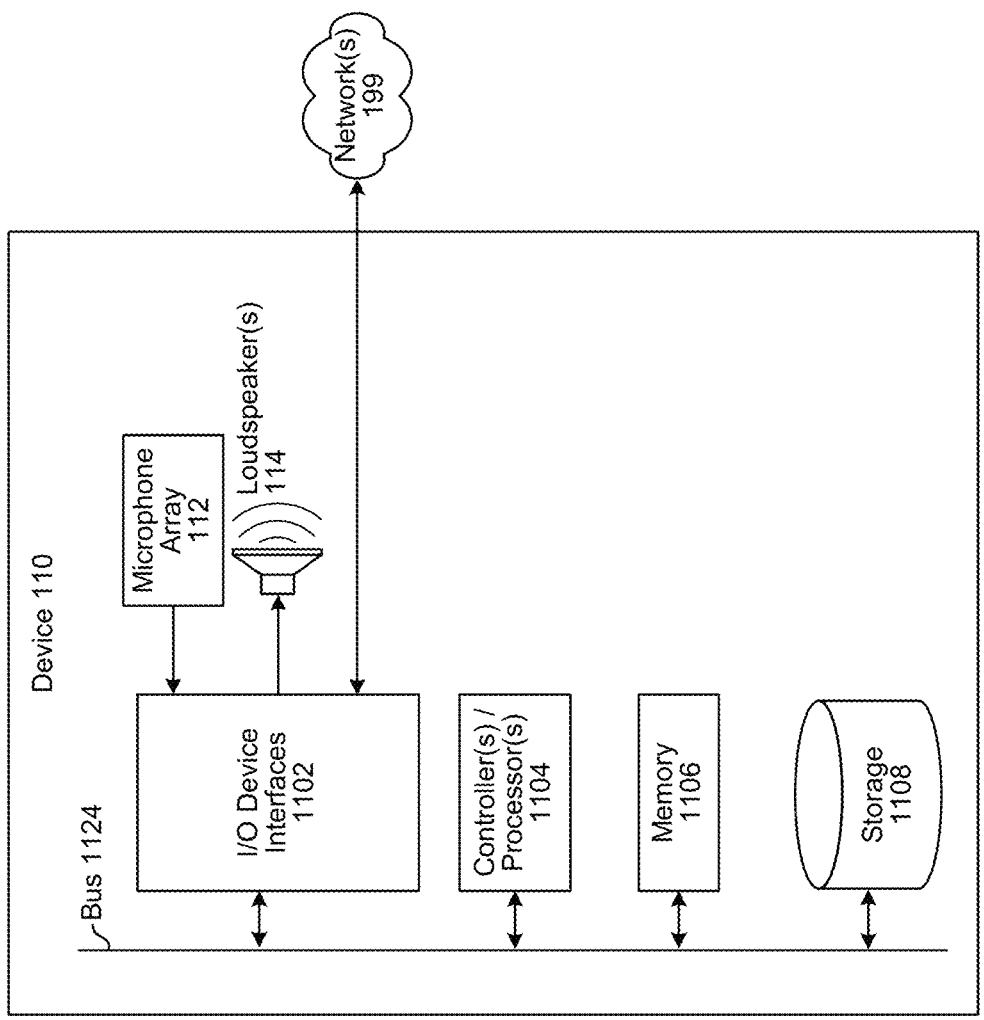

EXCURSION AND THERMAL MANAGEMENT FOR AUDIO OUTPUT DEVICES

BACKGROUND

With the advancement of technology, the use and popularity of electronic devices has increased considerably. Electronic devices are commonly used to receive audio data and generate output audio based on the received audio data. Described herein are technological improvements to such systems.

BRIEF DESCRIPTION OF DRAWINGS

For a more complete understanding of the present disclosure, reference is now made to the following description taken in conjunction with the accompanying drawings.

FIGS. 2A and 2B illustrate examples of frequency responses of a loudspeaker with and without temperature and/or excursion effects.

FIGS. 3A and 3B illustrate systems for managing temperature and excursion effects of a loudspeaker according to embodiments of the present disclosure.

FIGS. 4A and 4B illustrate systems for managing temperature and excursion effects for a low-frequency band of a loudspeaker according to embodiments of the present disclosure.

FIGS. 6A and 6B illustrate sources of temperature and excursion data according to embodiments of the present disclosure.

FIGS. 8A and 8B illustrate measured and modeled temperature and excursion data according to embodiments of the present disclosure.

FIG. 11 is a block diagram conceptually illustrating example components of a system for managing temperature and excursion effects of a loudspeaker according to embodiments of the present disclosure.

DETAILED DESCRIPTION

Electronic devices such as smart loudspeakers, cellular telephones, tablets, laptop computers, and other such devices, are becoming smaller and/or more portable. As the sizes of these devices shrink, the sizes of audio-output devices—i.e., loudspeakers—associated with the devices also shrink. As the sizes of the loudspeakers shrink, however, the quality of the audio output by the loudspeakers decreases, especially low-frequency audio output (i.e., bass).

The loudspeakers may be constructed using a frame, magnet, voice coil, and diaphragm. Electrical current moves through the voice coil, which causes a magnetic force to be applied to the voice coil; this force causes the membrane attached to the coil to move in accordance with the electrical current and thereby emit audible sound waves. The movement of the diaphragm is referred to herein as excursion. The membrane may, however, have a maximum excursion that, when reached, causes the sound output to be distorted. In addition, as the current in the loudspeaker flows through the voice coil, some of its energy is converted into heat instead of sound. If the temperature is too large, this heating can damage the voice coil.

Equalization, filtering, or similar pre-processing may be used to limit the excursion and/or temperature and thereby prevent or minimize the distortion and/or damage. To protect the loudspeaker, however, across all related factors such as loudspeaker variations, operating conditions, and audio signals, the filtering is conservative such that, under typical conditions, the loudspeaker does not operate at its optimal output.

Electronic devices may be used to receive audio data and generate audio corresponding to the audio data. For example, an electronic device may receive audio data from various audio sources (e.g., content providers) and may generate the audio using loudspeakers. The audio data may have large level changes (e.g., large changes in volume) within a song, from one song to another song, between different voices during a conversation, from one content provider to another content provider, and/or the like. For example, a first portion of the audio data may correspond to music and may have a high volume level (e.g., extremely loud volume), whereas a second portion of the audio data may correspond to a talk radio station and may have a second volume level (e.g., quiet volume). These high volume levels may cause excursion beyond an upper limit (i.e., over-excursion) and temperature beyond an upper limit, which may cause distortion in the output audio.

Figure 1:
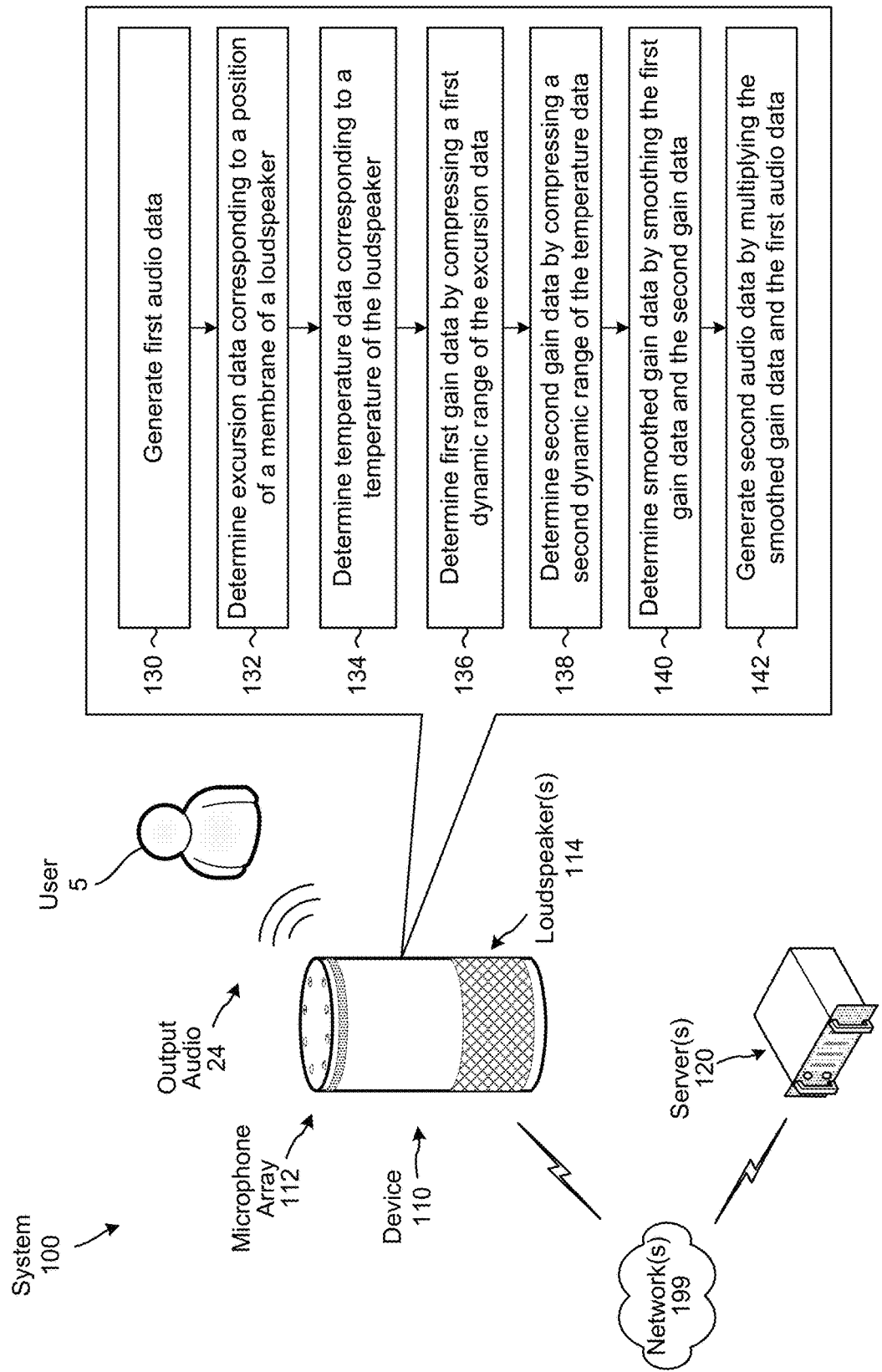
FIG. 1 illustrates a system for managing temperature and excursion effects of a loudspeaker according to embodiments of the present disclosure.

FIG. 1 illustrates a system 100 for protecting a loudspeaker 114 from membrane excursion and/or voice-coil heating during operation according to embodiments of the present disclosure. As illustrated in FIG. 1, a device 110 may include the loudspeaker 114 and a microphone array 112, and may communicate with one or more server(s) 120 via network(s) 199. While FIG. 1 illustrates the device 110 being a speech-controlled device, the disclosure is not limited thereto and the system 100 may include any device having a loudspeaker 114.

To improve a user experience and reduce or eliminate distortion in the output audio, the device 110 may manage excursion and/or temperature and reduce a level of output amplitude accordingly. In a first step, the device 110 may generate (130) first audio data using, for example, a filter. The first audio data may correspond to a first frequency band; the filter may generate multiple audio data corresponding to multiple frequency bands. The device 110 determines (132) excursion data corresponding to a position of a membrane of a loudspeaker and determines (134) temperature data corresponding to a temperature of the loudspeaker. As explained further herein, this data may be derived from sensor data (such as current-voltage data or power data from a current-voltage sensor) or from models. The excursion data may represent an excursion—i.e., displacement—of a membrane of a loudspeaker over time; the temperature data may represent a temperature of the loudspeaker over time. The device 110 determines (136) first gain data by compressing a first dynamic range of the excursion data and determines (138) second gain data by compressing a second dynamic range of the temperature data. The dynamic range of the data corresponds to an amount of variation of a variable in the data; compressing the dynamic range corresponds to reducing the amount of variation. For example, the dynamic range of the temperature data may be 10-30 degrees Celsius; a corresponding compressed dynamic range may be, for example, 15-25 degrees Celsius. The device 110 determines (140) smoothed gain data by smoothing the first gain data and the second gain data. The device 110 generates (142) second audio data by multiplying the smoothed gain data and the first audio data and sends the second audio data to the loudspeaker.

The device 110 may be configured to receive input audio data from the server(s) 120 and, using the input audio data, may generate output audio 24 for a user 5. For example, the server(s) 120 may send input audio data corresponding to music, text-to-speech (TTS) (e.g., TTS source(s)), news (e.g., radio broadcasts, flash briefings, daily briefings, etc.), streaming radio broadcasts (e.g., streaming radio source(s), talk radio station(s), music station(s), etc.), Voice-over-Internet Protocol (VoIP) communication sessions, or the like. The output audio 24 may instead or in addition be generated locally by the device 110.

A gain value is an amount of gain (e.g., amplification or attenuation) to apply to the input energy level to generate an output energy level. For example, the device 110 may apply the gain value to the input audio data to generate output audio data. A positive dB gain value corresponds to amplification (e.g., increasing a power or amplitude of the output audio data relative to the input audio data), whereas a negative dB gain value corresponds to attenuation (decreasing a power or amplitude of the output audio data relative to the input audio data). For example, a gain value of 6 dB corresponds to the output energy level being twice as large as the input energy level, whereas a gain value of −6 dB corresponds to the output energy level being half as large as the input energy level.

FIGS. 2A and 2B illustrate examples of an ideal frequency response 2A of a loudspeaker 114 and a frequency response 2B that includes effects of over-excursion and/or high temperature. Referring first to FIG. 2A, an ideal frequency response 202 increases from 0 Hz, is relatively flat in an audible frequency range of approximately 20 Hz-20 kHz, and falls again above frequencies above approximately 20 kHz. As shown in FIG. 2B, however, if the excursion limit of the membrane of the loudspeaker 114 is reached and/or if a temperature of the loudspeaker 114 increases past a limit, the resultant frequency response 204 may show deleterious effects. In this example, output frequencies between approximately 20 Hz and 200 Hz have corresponding gains less than that of the ideal response 2A; the gain may be nonlinear or uneven, producing distortion in addition to reduced output volume.

Figure 3B:
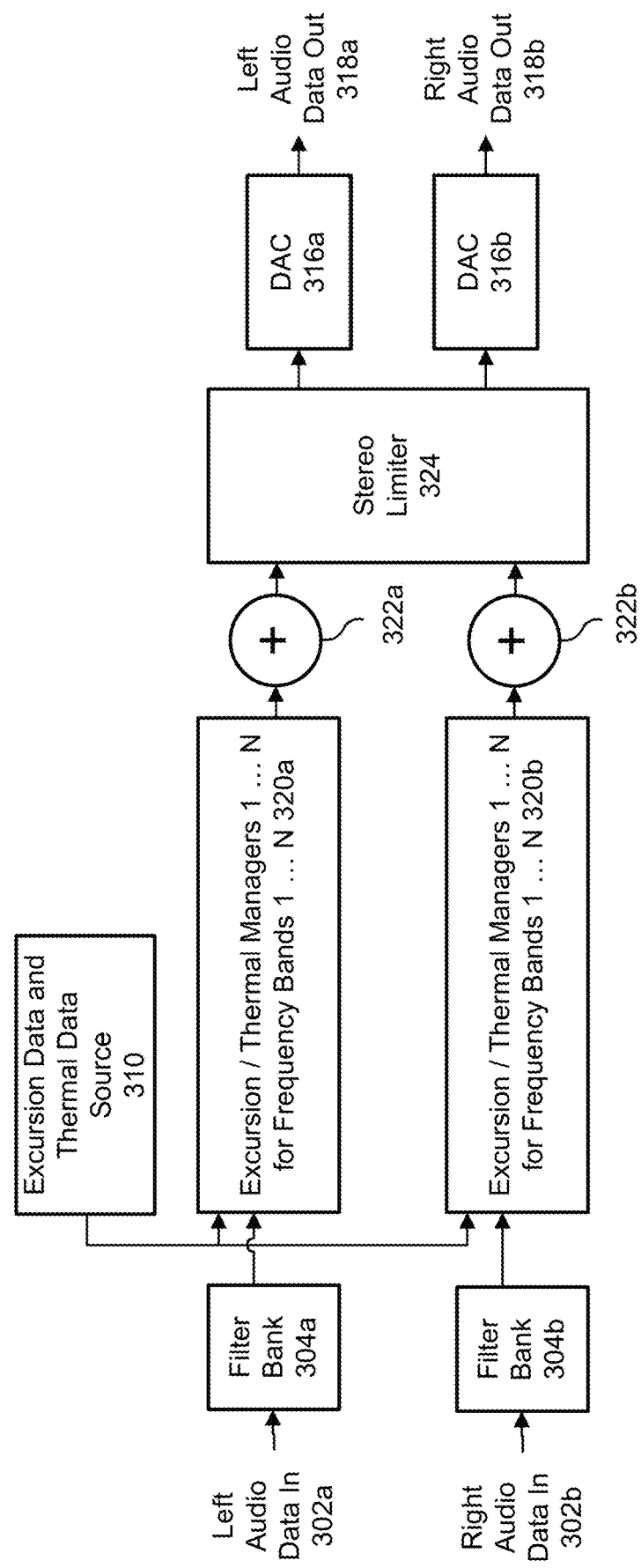

FIGS. 3A and 3B illustrate systems for managing temperature and excursion effects of a loudspeaker 114 according to embodiments of the present disclosure. In various embodiments, an audio input signal 302 is received. The audio input data 302 may be time-domain audio data or frequency-domain audio data and may be received from the device 110, the server(s) 120, or from any other source. The time-domain audio data may represent an amplitude of audio over time; the frequency-domain audio data may represent an amplitude of audio over frequency. The audio input data 302 may include a digital or analog representation of voice, music, silence, sound effects, and/or any other audio.

The audio input data 302 may be received by a filter bank 304 (which is described in greater detail with reference to FIG. 7). In various embodiments, the filter bank 304 converts the time-domain audio input data 302 from a full-band signal to a multiband signal, if necessary, and divides the full-band signal into two or more bands. In the present figure, the filter bank 304 divides the full-band signal into 1, 2, . . . , N bands; any number of bands are, however, within the scope of the present disclosure. The number of bands may be four; in this example, the range of frequencies of the first band may be 20 Hz-70 Hz, the range of frequencies of the second band may be 70 Hz-375 Hz, the range of frequencies of the third band may be 375 Hz-3750 Hz, and the range of frequencies of the fourth band may be 3750 Hz-20 kHz. In some embodiments, the filter bank 304 is a reconfigurable filter bank, and the number and size of the frequency bands may be reconfigured.

First audio data corresponding to the first band having a lowest range of frequencies is received by a first excursion/thermal manager 306 that, as explained in greater detail below, also receives excursion data and thermal data from a data source 310. The first excursion/thermal manager 306 may modify the first audio data based on the excursion data and thermal data, as explained in greater detail with reference to FIGS. 4A and 4B. A second thermal manager 308a may receive second audio data corresponding to the second band and may receive thermal data from the data source 310; the second thermal manager 308a may modify the second audio data based on the thermal data, as explained in greater detail with reference to FIG. 5. Similarly, a third thermal manager 308b may receive third audio data corresponding to the third band and may receive thermal data from the data source 310; the third thermal manager 308b may modify the third audio data based on the thermal data. An Nth thermal manager 308N may receive Nth audio data corresponding to the Nth band and may receive thermal data from the data source 310; the Nth thermal manager 308N may modify the Nth audio data based on the thermal data.

As described herein, the first excursion/thermal manager 306 modifies the first audio data based on both the excursion and the thermal data, while thermal managers 308 modify their corresponding audio data based only on the thermal data. In some embodiments, the effects of over-excursion are experienced only by low frequencies corresponding to the first band and, thus, modifying the other bands in accordance with the excursion data is not required. In other embodiments, however, more than one band is modified using both the excursion and the thermal data; in some embodiments, all bands are modified using both the excursion and the thermal data.

The outputs of the managers 306, 308 may be added together using a summation component 312; the summation component 312 may combine the various modified audio data corresponding to the different bands (e.g., 20 Hz-70 Hz, 70 Hz-375 Hz, 375 Hz-3750 Hz, and 3750 Hz-20 kHz) into audio data representing the entire range of frequencies (e.g., 20 Hz-20 kHz), which may be referred to as full-band audio data.

The output of the summation component 312 may be received by a limiter 314. The limiter 314 may process the full-band audio data to remove undesired amplitude peaks; i.e., to prevent the full-band audio signal from exceeding positive and negative maximum amplitude limits. For example, the limiter 314 may suppress any portion of the full-band audio data that has a peak that is greater than an upper amplitude limit or less than a lower amplitude limit. The limiter 314 may, for example, attenuate the full-band audio data such that any peaks of full-band output audio signal remain within the maximum amplitude limits. Limiting said amplitude peaks may lessen or prevent damage to any circuitry or components of the device 110. In addition the limiter 314 may reduce the total harmonic distortion of the full-band audio data.

The limiter 314 may be a limiter that performs "hard" limiting (i.e., clipping) or a limiter that performs "soft" limiting. A hard limiter shears off peaks in the audio signal that are outside of the limits, squares off the sheared-off portion of the signal waveform, and replaces waveform peaks outside the limits with a steady-state maximum amplitude at or below the limit. Clipping in an audio signal that is amplified and output by loudspeakers may be perceived as a generalized harmonic distortion and/or as loud "pops."

In comparison, a soft limiter dynamically adjusts an attenuation applied to the input audio signal so that peaks are (in an ideal system) reduced to be within the confines of the limits. A soft limiter is a form of dynamic range compression. Dynamic range compression reduces the volume of loud sounds by narrowing or compressing an audio signal's dynamic range. Soft limiters engage in downward compression, reducing the volume of loud sounds that have peaks outside of the limits. While the attenuation is held constant, the original shape of the wave is retained; as the soft limiter ramps up or ramps down attenuation, however, the shape of the wave is subtly altered, with the distortion introducing harmonic components into the waveform: the faster the attenuation ramps up (referred to as the "attack") and ramps down (referred to as the "release"), the greater the distortion. A soft limiter may create significantly less harmonic distortion in the output waveform than is produced by the clipping of a hard limiter.

The output of the limiter 314 may be received by a digital-to-analog converter (DAC) 316. The DAC 316 may be, for example, a delta-sigma DAC or an R-2R ladder DAC. The DAC 316 may convert the digital audio data output by the limiter 314 into an analog audio data signal 318, which may be sent to the loudspeaker 114 for output.

FIG. 3B illustrates another embodiment of the present disclosure for outputting stereo sound. In this embodiment, a first filter bank 304a receives time-domain left-channel audio data in 302a, and a second filter bank 302b receives time-domain right-channel audio data in 302b. A first set of managers 320a receives the output of the first filter bank 304a, and a second set of managers 320b receives the output of the second filter bank 304b. The managers 320 may each include the excursion/thermal manager 306 and one or more thermal managers 308 as described above with reference to FIG. 3A and may function similarly for each of the left and right audio data. A summation element 322a may add the left-channel N band outputs of the managers 320a, summation element 322b may add the right-channel N band outputs of the managers 320b, and a stereo limiter 324 may limit any peaks of the output of the summation elements 322a and 322b in a manner similar to that of the limiter 314 described above with reference to FIG. 3A. A first DAC 316a may convert digital left audio data output of the stereo limiter 324 to analog output left audio data out 318a, and a second DAC 316b may convert digital right audio data of the stereo limiter 324 to analog output right audio data out 318b. Other sound configurations, such as 5.1 and 7.1 audio, are within the scope of the present disclosure; 5.1 output audio may be generated by, for example, adding another excursion/thermal manager to the system of FIG. 3B for processing mono sound; the output of this excursion/thermal manager may be added to the others 320 by the summation component 322.

Figure 4B:
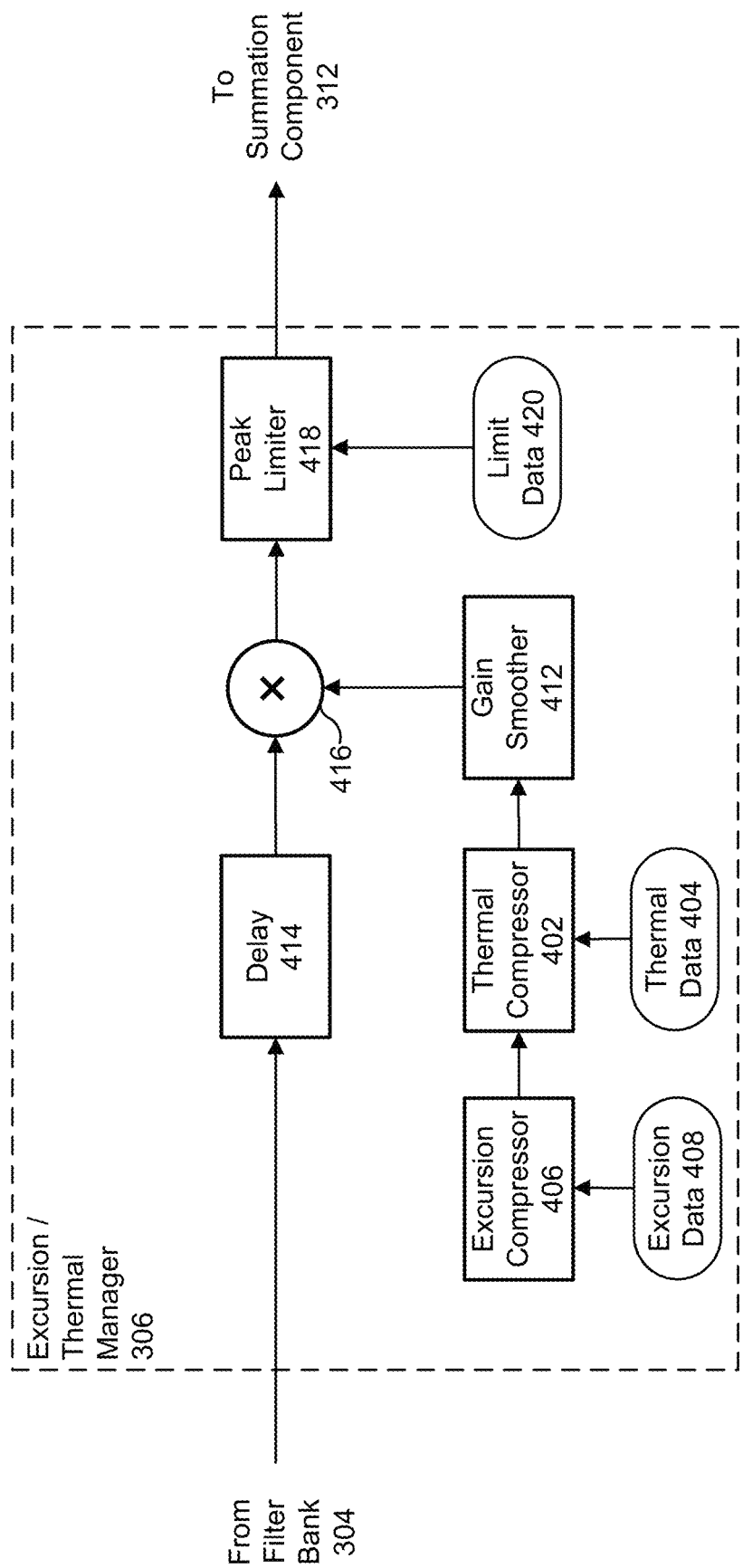

FIGS. 4A and 4B illustrate systems for managing temperature and excursion effects for a low-frequency band (e.g., the first band of 20 Hz-70 Hz described above) of audio data according to embodiments of the present disclosure. Referring first to FIG. 4A, the excursion/thermal manager 306 is described in greater detail. In various embodiments, a thermal compressor 402 creates compressed data by compressing a dynamic range of thermal data 404, and an excursion compressor 406 creates compressed data by compressing a dynamic range of excursion data 408. A first multiplication element 410 multiplies the gain outputs of the thermal compressor 402 and the excursion compressor 406; the output of the multiplication element 410 is smoothed by a gain smoother 412. Smoothing data corresponds to processing the data to remove variations in the data larger than a threshold. A delay element 414 delays audio data from the filter bank 304 to account for delays corresponding to the thermal compressor 402, excursion compressor 406, and/or gain smoother 412. A second multiplication element 416 multiplies the outputs of the delay element 414 and the gain smoother 412. A peak limiter 418 may limit peak amplitudes of the output of the second multiplication element 416 in accordance with excursion and/or temperature limit data 420; the output of the peak limiter 418 may be sent to the summation component 312 of FIG. 3A.

The thermal compressor 402 and excursion compressor 406 may be filters, such as finite-impulse response (FIR) and infinite-impulse response (IIR) filters, that create compressed data by applying a variable gain to the thermal data 404 and excursion data 408. If the thermal data 404 and/or excursion data 408 indicates a temperature and/or excursion greater than a temperature threshold and/or excursion threshold, the thermal compressor 402 and/or excursion compressor 406 may create compressed data by compressing the input data, for example, applying a gain less than 1.0. If, on the other hand, the thermal data 404 and/or excursion data 408 indicates a temperature and/or excursion less than the temperature threshold and/or excursion threshold, the thermal compressor 402 and/or excursion compressor 406 may pass the corresponding data with no compression effect, for example, applying a gain factor of 1.0. A range of gains to be applied to input values may correspond to a gain curve for each of the thermal compressor 402 and excursion compressor 406.

Each gain curve may be determined by experimentation, for example, sending different values and types of audio output data to the loudspeaker 114 and observing the response of the loudspeaker 114. For example, a frequency response, such as the frequency responses of FIGS. 2A and 2B, may be measured for varying inputs of the loudspeaker 114. If the frequency response of the loudspeaker 114 resembles the distorted frequency response of FIG. 2B, the gain curves of the thermal compressor 402 and/or excursion compressor 406 may be adjusted to have lower values. If, however, the frequency response of the loudspeaker 114 resembles the ideal frequency response of FIG. 2A, the gain curves of the thermal compressor 402 and/or excursion compressor 406 may be adjusted to have higher values. A representative number of loudspeakers 114, such as twenty loudspeakers 114, may be tested in this manner to determine the gain curves—the determined gain curves of each loudspeaker 114 may be averaged to determined final gain curves. Different gain curves may be determined for different types and instances of loudspeakers 114.

The first multiplication component 410 may be a mixer and may mix the outputs of the thermal compressor 402 and excursion compressor 406. In some embodiments, the thermal data 404 and excursion data 408 are converted to the logarithmic domain, and the first multiplication component 410 adds the logarithmic data.

The gain smoother 412 may be a filter, such as an FIR or IIR filter, which may function as a low-pass filter. The gain smoother 412 smooths data for a current frame n of audio by outputting data from a previous frame (n−1) as modified by a difference between the output g of the previous frame and a current input from the current frame—multiplied by a smoothing factor $\alpha_k$. The below equation expresses the output of the gain smoother 412 for band k.

$$g(k,n)=g(k,n-1)+\alpha_k\times\{\text{IntermediateGain}(k,n)-g(k,n-1)\} \tag{1}$$

The smoothing factor $\alpha_k$ may be any value between 0.0 and 1.0. In some embodiments, the smoothing factor $\alpha_k$ is 0.0015278, which corresponds to a time constant of 30 milliseconds and a 48 kHz sampling rate. The different frequency bands may have different smoothing factors $\alpha_k$, but each corresponding band may have the same smoothing factor $\alpha_k$ across different channels. The smoothing factor $\alpha_k$ for the first excursion/temperature manager 306 may be smaller than that of the smoothing factor $\alpha_k$ of the other temperature managers 308 because the excursion may change much faster than the temperature.

Thus, the gain smoother 412 incorporates previous gain values to reduce the variation of the dynamic gain, with an amount of previous gains determined based on the value chosen for the factor $\alpha_k$. For example, $\alpha_k=0$ corresponds to only using the initial gain value (i.e., constant), $\alpha_k=1$ corresponds to using an instantaneous gain value, and $0<\alpha_k<1$ corresponds to a variable amount of smoothing. As a result, the gain smoother 412 ramps between different gain values when the compander settings 412 dynamically switches between different settings for various audio categories and/or volume index values.

A delay element 414 may be used to delay the audio data from the filter bank 304 to account for delay associated with the thermal compressor 402, the excursion compressor 406, and/or the gain smoother 412. The delay element 414 may be, for example, an FIR or IIR filter, and may delay the audio data by one, two, or more samples. The second multiplication component 416 multiplies the output of the delay element 414 and the output of the gain smoother 412 in accordance with the below equation.

$$\text{Out}(k,n,i)=g(k,n)\times\text{In}(k,(n-1)\times L-D+i) \tag{2}$$

In the above equation, L is the frame length in samples, and i ranges from 0 to L−1. L may be, for example, 96 samples for 2 milliseconds of 48 kHz sampling rate.

The peak limiter 418 may be a filter and remove peak amplitudes from the output of the multiplier 416. The peak limiter 418 may process the output data to remove peak amplitudes greater than a peak limit represented in limit data 420; i.e., to prevent the output data from exceeding positive and negative maximum amplitude limits specified by the limit data 420, which may drive the membrane of the loudspeaker past a maximum excursion and thereby damage the loudspeaker. For example, peak limiter 418 may suppress any portion of the data that has a peak amplitude that is greater than an upper amplitude limit. The peak limiter 418 may, for example, attenuate the data such that any peak amplitudes of the data remain within the maximum amplitude limits. Limiting said peak amplitudes may lessen or prevent damage to any circuitry or components of the device 110. In addition the peak limiter 418 may reduce the total harmonic distortion of the data. As mentioned above, the peak limiter 418 may be a hard or soft limiter.

FIG. 4B illustrates another embodiment of the present disclosure. In this embodiment, rather than performing the excursion compression and thermal compression in parallel (and combining their outputs with the first multiplication element 410), the excursion compressor 406 and the thermal compressor 402 are in series. As illustrated, the excursion compression is performed first and the thermal compression is performed thereafter; in other embodiments, however, the order of the compression (and corresponding placement of the thermal 402 and excursion 406 compressors) is swapped.

Figure 5:
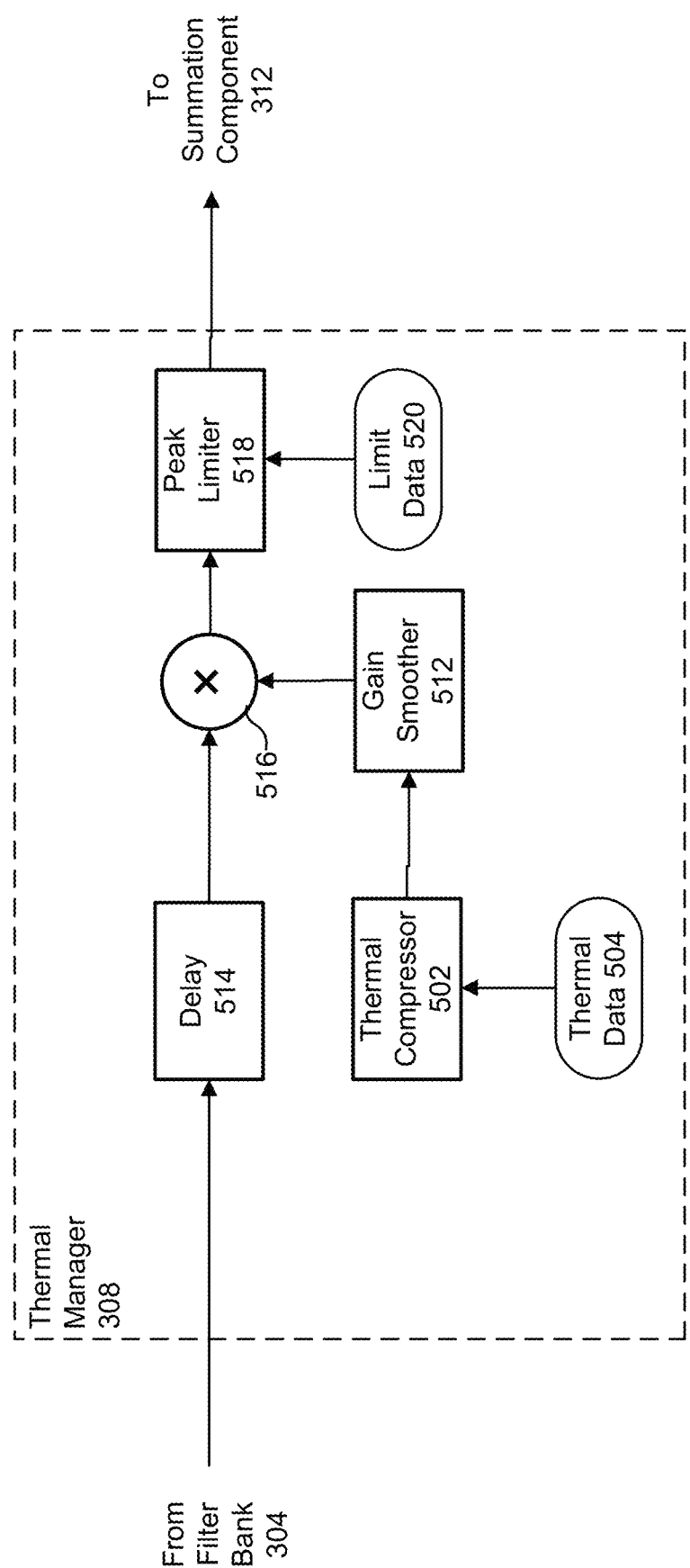
FIG. 5 illustrates a system for managing temperature and excursion effects for another frequency band of a loudspeaker according to embodiments of the present disclosure.

FIG. 5 illustrates one embodiment of one of the thermal managers 308 of FIG. 3A. The embodiment includes a thermal compressor 502 that receives thermal data 504, a gain smoother 512, a multiplication element 516 that multiplies the output of the gain smoother 512 and a delay element 514, and a peak limiter 518 that limits peaks based on limit data 520. Each of these components function similarly to the corresponding components of FIGS. 4A and 4A but may have different sizes and/or operating parameters, such as different gain curves and different smoothing factors.

Figure 6B:
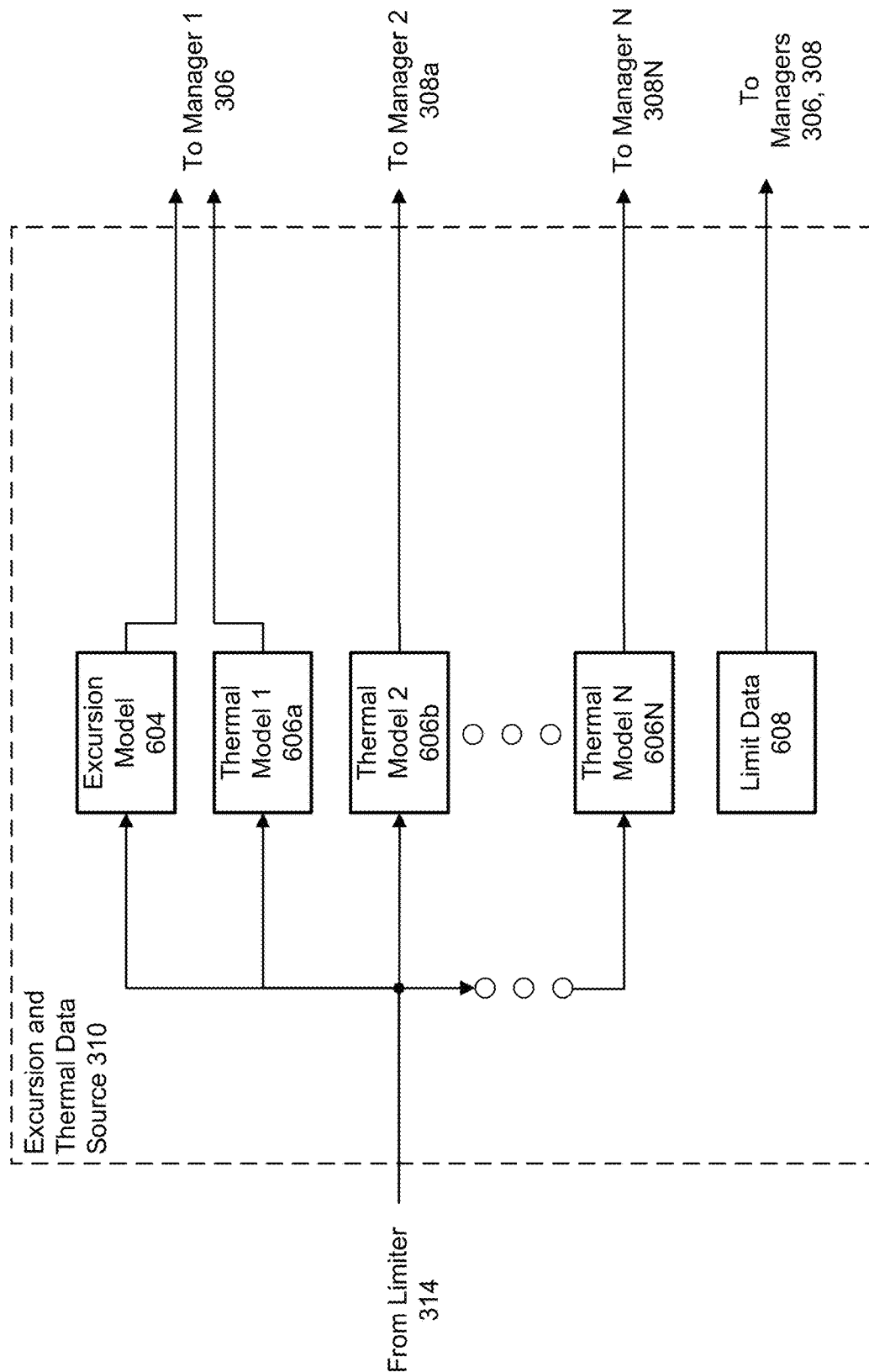

FIGS. 6A and 6B illustrate various embodiments of the excursion and thermal data source 310 of FIGS. 3A and 3B. Referring first to FIG. 6A, the excursion and thermal data source 310 includes a sensor 602, such as a current-voltage (IV) sensor, that senses a voltage, current, and/or voltage× current (i.e., power) corresponding to the DAC 316. The sensor 602 may be physically located in or near the DAC 316 or may be located outside the DAC 316. The sensor 602 may sense the voltage and/or current of the output signal of the DAC 316; this sensed voltage and/or current may correspond to audio data being sent to the loudspeaker 114. For example, if a loud audio signal is being sent to the loudspeaker 114, the sensed voltage and/or current may be high. The managers 306, 308 receive the sensed current and/or voltage and may derive the excursion and temperature of the loudspeaker therefrom. For example, a high voltage may correspond to a high excursion, and a history of high voltages may correspond to a high temperature.

FIG. 6B illustrates another embodiment of the excursion and thermal data source 310 of FIGS. 3A and 3B. In this embodiment, the excursion and temperature are predicted using an excursion model 604 and thermal models 606 and are based on an output of the limiter 314 of FIG. 3A. The models 604, 606 may be filters, memories, look-up tables, or other such components. As explained above, parameters for the models may be determined by testing one or more loudspeakers 114 for, for example, frequency response.

Figure 7:
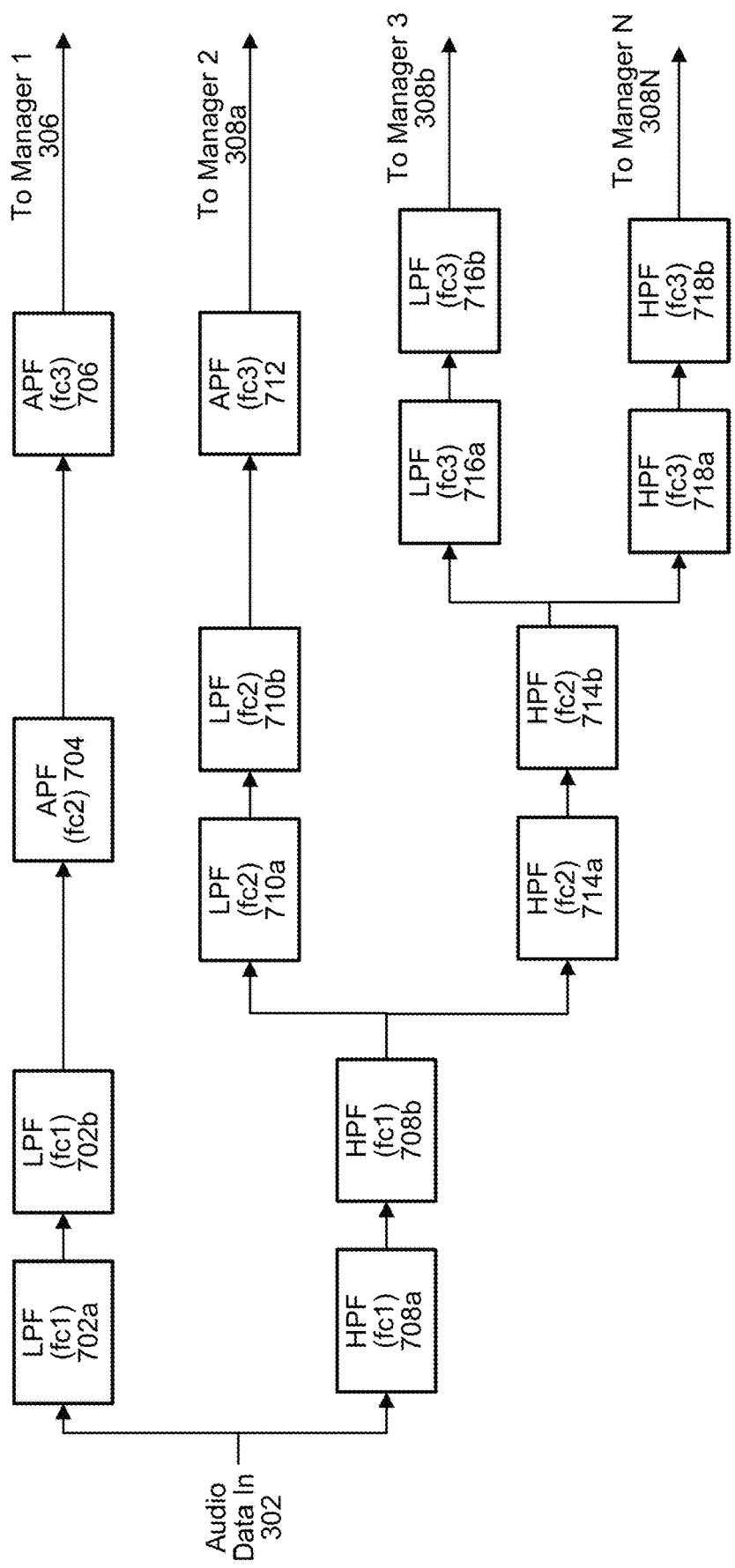
FIG. 7 illustrates a filter bank according to embodiments of the present disclosure.

FIG. 7 illustrates one embodiment of the filter bank 304; the present disclosure is not, however, limited to any particular implementation thereof. In the figure, fc1, fc2, and fc3 represent various crossover frequencies; fc1 may be, for example, 70 Hz. fc2 may be, for example 375 Hz, and fc3 may be, for example, 3750 Hz. The sampling rate may be 48 kHz. LPF, HPF, and APF represent a low-pass filter, high-pass filter, and all-pass filter, respectively. The APFs may match phase responses between bands. Two cascaded LPF filters, two cascaded HPF filters, and one APF have the same phase response if they have the same crossover frequency. Therefore, the outputs of each band are in-phase. The number of frequency bands and corresponding non-uniform bandwidths (e.g., frequency ranges) may be user-adjustable and/or reconfigurable during device operation.

A first frequency band for the first manager 306 is generated by passing audio data input 302 through a first pair of LPFs 702a, 702b having a first crossover frequency, an APF 704 having a second crossover frequency, and an APF 706 having a third crossover frequency. A second frequency band for the second manager 308a is generated by passing audio data input 302 through a first pair of HPFs 708a, 708b having a first crossover frequency, a pair of LPFs 710a, 710b having a second crossover frequency, and an APF 712 having a third crossover frequency. A third frequency band for the third manager 308b is generated by passing audio data input 302 through the first pair of HPFs 708a, 708b having a first crossover frequency, a second pair of HPFs 714a, 714b having a second crossover frequency, and a third pair of LPFs 716a, 716b having a third crossover frequency. A Nth frequency band for the Nth manager 308N is generated by passing audio data input 302 through the first pair of HPFs 708a, 708b having a first crossover frequency, the second pair of HPFs 714a, 714b having a second crossover frequency, and a third pair of HPFs 718a, 718b having a third crossover frequency.

8A and 8B illustrate measured and modeled temperature 802 and excursion 804 according to embodiments of the present disclosure. Referring first to FIG. 8A, as mentioned above, temperature data 806 and/or excursion data 808 may be derived from data from a sensor, such as the current-voltate (IV) sensor 602. As also mentioned above, the excursion data 808 changes much more rapidly than the temperature data 806. The excursion data 808 may increase or decrease as audio output data increases or decreases in magnitude. The temperature data 806 may increase after a period of time in which the excursion data 808 indicates high excursions and may decrease after a period of time in which the excursion data 808 indicates low excursions.

Figure 8B:
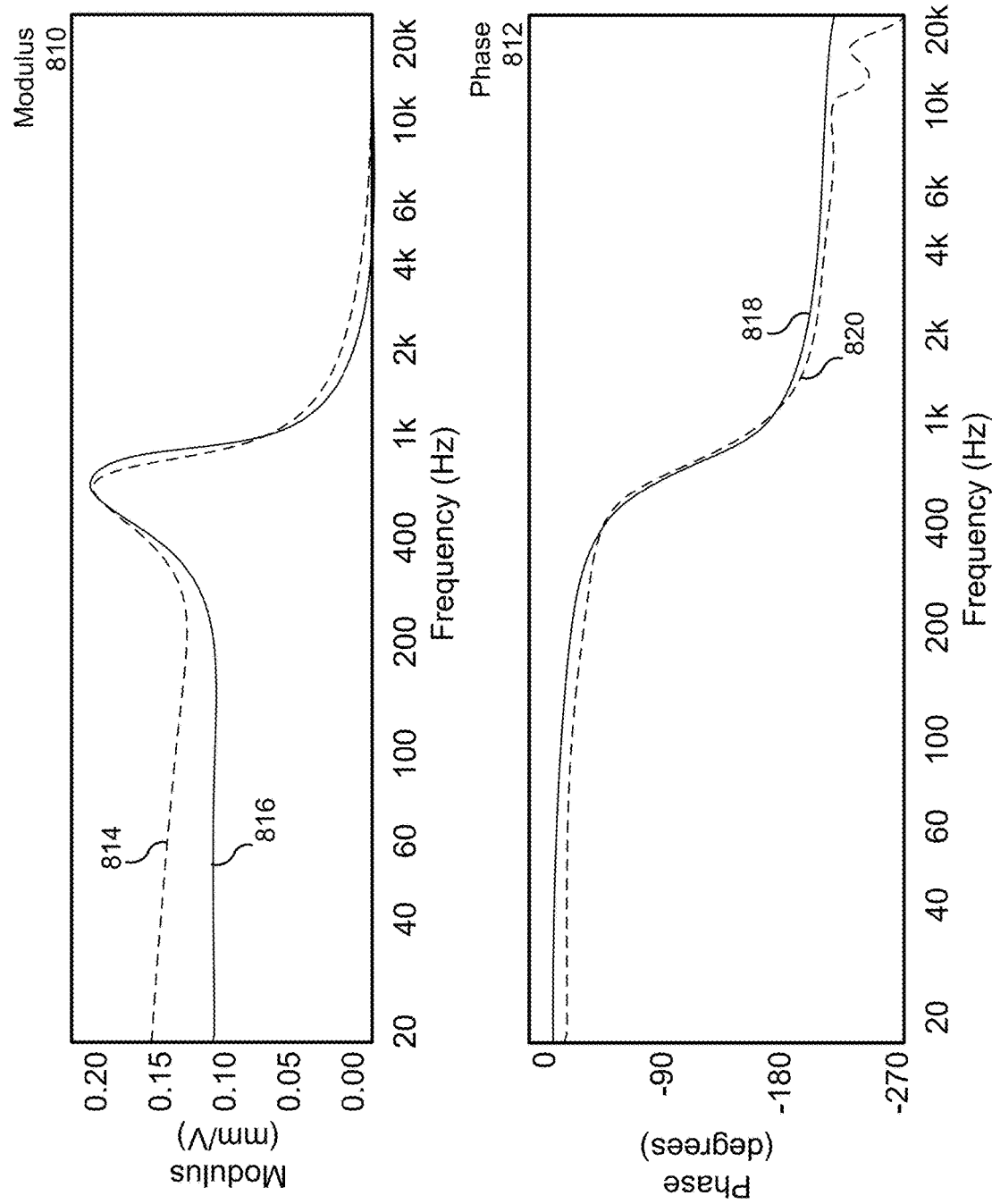

Referring to FIG. 8B, the modulus 810 and phase 812 corresponding to the excursion model 604 and/or thermal models 606 are illustrated. A measured modulus 814 and a modeled modulus 816 are illustrated, as are a measured phase 820 and a modeled phase 818. The modeled values 816, 818 may be predicted based on measuring the measured values 814, 820 and configuring the models 604, 606 to behave similarly. For example, the models 604, 606 may be IIR filters having coefficients such that, when the filters receive data from the limiter 314 and/or DAC 316, the filters output data corresponding to the illustrated curves 816, 818. The resonance frequencies of the loudspeaker for the excursion model may be approximately less than 1 kHz.

Figure 9A:
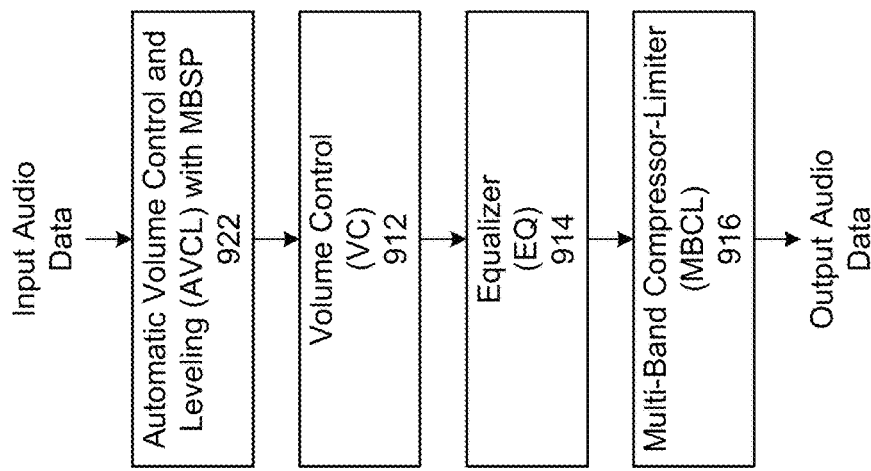
FIGS. 9A, 9B, and 9C illustrate flows for processing audio data according to embodiments of the present disclosure.
Figure 9B:
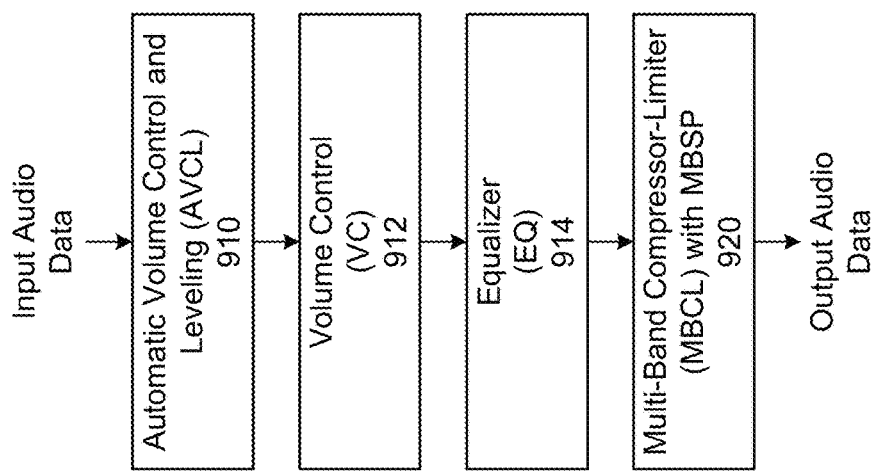
Figure 9C:
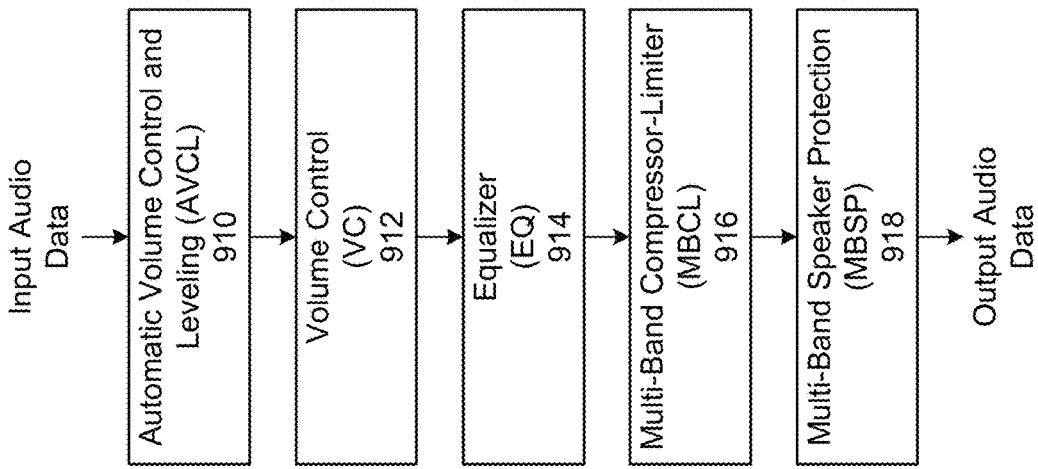

FIGS. 9A-9C illustrate flows for processing audio data according to embodiments of the present disclosure. As illustrated in FIG. 9A, an automatic volume control and leveler 910 may receive input audio data and perform AVCL to generate first audio data, which is output to a volume control (VC) 912. The VC 912 may perform volume control (e.g., embedded volume control) to generate second audio data, which is output to an equalizer (EQ) 914. The VC 912 may, for example, determine that a volume level corresponding to audio data is greater than a maximum volume threshold, and, if so, may reduce the volume level to the maximum volume threshold. The EQ 914 may perform equalization (e.g., apply different gain values to different frequency bands of the second audio data) to generate third audio data, which is output to a multi-band compressor-limiter (MBCL) 916. The MBCL 916 may perform multi-band compression/limiting (e.g., compensate for distortion that is unique to one or more loudspeaker(s) associated with the device 110) to generate fourth audio data. The fourth audio data may be sent to a multi-band (loud)speaker protection (MBSP) system, such as the systems of FIGS. 3A and 3B to generate fifth audio data, which is output as output audio data to be sent to the one or more loudspeaker(s). The one or more loudspeaker(s) may generate output audio based on the output audio data.

The AVCL 910 performs audio processing specific for the raw input audio data (or portions of the raw input audio data) based on the audio source, the audio category, the volume index value, and/or the like. Thus, the audio processing performed by the AVCL 910 changes dynamically based on the raw input audio data. In contrast, the MBCL 916 performs audio processing specific for the one or more loudspeaker(s) that are associated with the device 110 and used to generate the output audio. Thus, the audio processing performed by the MBCL 916 is static for the device 110.

The audio processing performed by the VC 912 is intended to convert volume levels from a logarithmic scale (e.g., decibels) to a linear scale (e.g., volume value between 0.0-1.0). For example, the VC 912 may correspond to embedded volume control that converts from a logarithmic scale associated with the first audio data to a linear scale associated with the second audio data.

The audio processing performed by the EQ 914 depends on settings and/or user preferences stored by the device 110 and/or applications running on the device 110. For example, equalization settings may be static for the device 110, may be genre-specific (e.g., equalization settings change based on the genre of music identified by an audio classifier), may be user-specific (e.g., equalization settings change based on user profile), may be application or process specific (e.g., each process running on the device 110 has different equalization settings), and/or may be controlled by a user interface (e.g., enabling the user 5 to easily change the equalization settings). Thus, in some examples the equalization settings may vary depending on a time of day, a source of audio, an application, a genre of music, and/or the like. To illustrate an example of the equalization settings varying based on genre, the audio classifier may determine that the input audio data corresponds to a first audio category (e.g., music) and further to a first subcategory (e.g., genre of music). The audio classifier may send the first audio category and/or the first subcategory to the compander settings in order to select an appropriate gain curve for the adaptive noise gate, compressor, and expander. In addition, the audio classifier and/or the compander settings may send the first subcategory to the EQ 914 in order to select appropriate equalization settings. Thus, the EQ 914 may apply first equalization settings for a first genre of music (e.g., jazz) and second equalization settings for a second genre of music (e.g., rock).

FIGS. 9B and 9C are similar to FIG. 9A and include many similar components. With reference to FIG. 9B, instead of the discrete MB SP component 918 of FIG. 9A, the functionality of the MBSP is incorporated into a combined MBSP and MBCL component 920. With reference to FIG. 9C, the functionality of the MBSP is combined with the AVCL component 922.

Figure 10B:
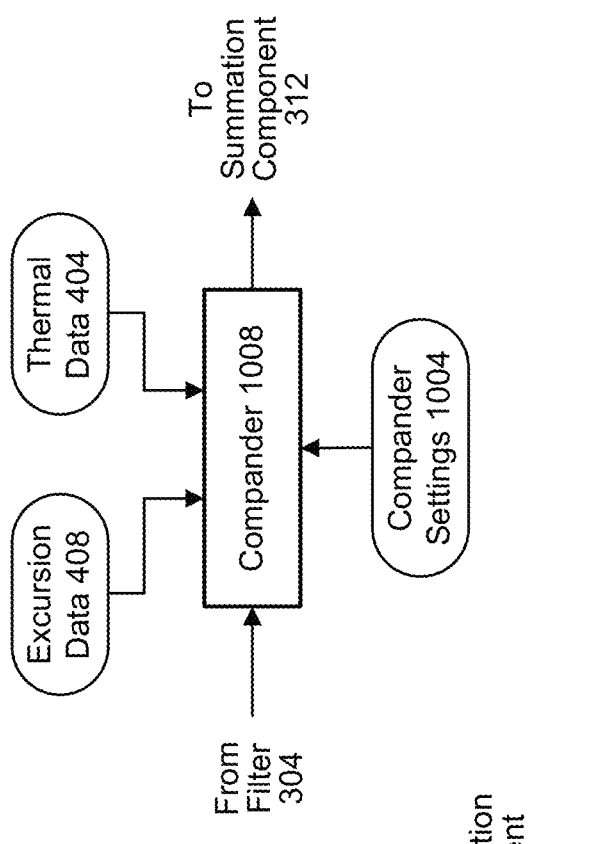
FIGS. 10A and 10B illustrate systems for managing temperature and excursion effects of a loudspeaker using a compander according to embodiments of the present disclosure.
Figure 10A:
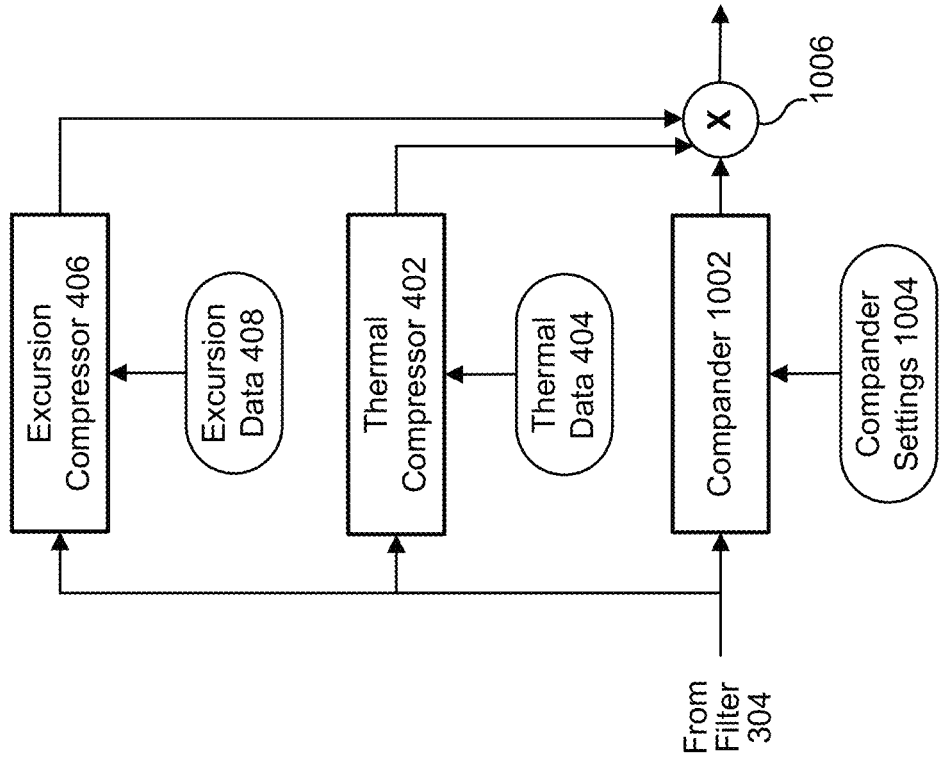

FIGS. 10A and 10B illustrate systems in which the functionality of the MBSP described herein may be incorporated into other components, such as the AVCL component 910 of FIG. 9C. Referring first to FIG. 10A, the thermal compressor 402 and excursion compressor 406 may be placed in parallel with a compander 1002 that may, for example, adjust volume levels in accordance with compander settings 1004, which may include, for example, audio category, signal-to-noise ratio (SNR) estimate, loudness estimate, or other settings. The outputs of the compressors 402, 406, and the compander 1002 may be combined with a multiplication element 1006. In another embodiment, with reference to FIG. 10B, the functions of the excursion compressor 406 and/or thermal compressor 402 are combined into another compander 1008 that performs both excursion and/or thermal compression in addition to other functions, such as volume leveling.

FIG. 11 is a block diagram conceptually illustrating example components of the system 100. In operation, the system 100 may include computer-readable and computer-executable instructions that reside on the device 110, as will be discussed further below.

The device 110 may include one or more audio capture device(s), such as a microphone 112 or an array of microphones. The audio capture device(s) may be integrated into the device 110 or may be separate. The device 110 may also include an audio output device for producing sound, such as loudspeaker(s) 114. The audio output device may be integrated into the device 110 or may be separate. In some examples the device 110 may include a display, but the disclosure is not limited thereto and the device 110 may not include a display or may be connected to an external device/display without departing from the disclosure.

The device 110 may include an address/data bus 1124 for conveying data among components of the device 110. Each component within the device 110 may also be directly connected to other components in addition to (or instead of) being connected to other components across the bus 1124.

The device 110 may include one or more controllers/processors 1104, which may each include a central processing unit (CPU) for processing data and computer-readable instructions, and a memory 1106 for storing data and instructions. The memory 1106 may include volatile random access memory (RAM), non-volatile read only memory (ROM), non-volatile magnetoresistive (MRAM) and/or other types of memory. The device 110 may also include a data storage component 1108, for storing data and controller/processor-executable instructions. The data storage component 1108 may include one or more non-volatile storage types such as magnetic storage, optical storage, solid-state storage, etc. The device 110 may also be connected to removable or external non-volatile memory and/or storage (such as a removable memory card, memory key drive, networked storage, etc.) through the input/output device interfaces 1102.

Computer instructions for operating the device 110 and its various components may be executed by the controller(s)/processor(s) 1104, using the memory 1106 as temporary "working" storage at runtime. The computer instructions may be stored in a non-transitory manner in non-volatile memory 1106, storage 1108, or an external device. Alternatively, some or all of the executable instructions may be embedded in hardware or firmware in addition to or instead of software.

The device 110 includes input/output device interfaces 1102. A variety of components may be connected through the input/output device interfaces 1102, such as the microphone array 112, the loudspeaker(s) 114, and/or the display. The input/output interfaces 1102 may include A/D converters for converting the output of the microphone array 112 into microphone audio data, if the microphone array 112 is integrated with or hardwired directly to the device 110. If the microphone array 112 is independent, the A/D converters will be included with the microphone array 112, and may be clocked independent of the clocking of the device 110. Likewise, the input/output interfaces 1102 may include D/A converters for converting output audio data into an analog current to drive the loudspeakers 114, if the loudspeakers 114 are integrated with or hardwired to the device 110. However, if the loudspeakers 114 are independent, the D/A converters will be included with the loudspeakers 114 and may be clocked independent of the clocking of the device 110 (e.g., conventional Bluetooth loudspeakers).

The input/output device interfaces 1102 may also include an interface for an external peripheral device connection such as universal serial bus (USB), FireWire, Thunderbolt or other connection protocol. The input/output device interfaces 1102 may also include a connection to one or more networks 10 via an Ethernet port, a wireless local area network (WLAN) (such as WiFi) radio, Bluetooth, and/or wireless network radio, such as a radio capable of communication with a wireless communication network such as a Long Term Evolution (LTE) network, WiMAX network, 3G network, etc.

The concepts disclosed herein may be applied within a number of different devices and computer systems, including, for example, general-purpose computing systems, multimedia set-top boxes, televisions, stereos, radios, server-client computing systems, telephone computing systems, laptop computers, cellular phones, personal digital assistants (PDAs), tablet computers, wearable computing devices (watches, glasses, etc.), other mobile devices, etc.

The above aspects of the present disclosure are meant to be illustrative. They were chosen to explain the principles and application of the disclosure and are not intended to be exhaustive or to limit the disclosure. Many modifications and variations of the disclosed aspects may be apparent to those of skill in the art. Persons having ordinary skill in the field of digital signal processing should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Aspects of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

As used in this disclosure, the term "a" or "one" may include one or more items unless specifically stated otherwise. Further, the phrase "based on" is intended to mean "based at least in part on" unless specifically stated otherwise.

What is claimed is:

1. A computer-implemented method comprising:
generating first audio data;
determining excursion data corresponding to a position of a membrane of a loudspeaker;
determining temperature data corresponding to a temperature of the loudspeaker;
determining first gain data by compressing a first dynamic range of the excursion data;
at least partially in parallel to determining the first gain data, determining second gain data by compressing a second dynamic range of the temperature data;
determining first smoothed gain data by multiplying the first gain data and the second gain data; and
generating second audio data by multiplying the first smoothed gain data and the first audio data.

2. The computer-implemented method of claim 1, further comprising:
   generating third audio data;
   determining third gain data by compressing the second dynamic range of the temperature data;
   determining second smoothed gain data by smoothing the third gain data; and
   generating fourth audio data by multiplying the second smoothed gain data and the third audio data.

3. The computer-implemented method of claim 2, further comprising:
   generating fifth audio data by adding the second audio data and the fourth audio data;
   generating analog audio data using the fifth audio data; and
   sending, to the loudspeaker, the analog audio data.

4. The computer-implemented method of claim 2, wherein:
   generating the first audio data further comprises determining a first frequency range of input audio data;
   generating the third audio data further comprises determining a second frequency range of the input audio data; and
   the second frequency range is higher than the first frequency range.

5. The computer-implemented method of claim 1, further comprising:
   determining that a peak amplitude represented in the second audio data is greater than a peak limit corresponding to a maximum excursion of the membrane;
   generating third audio data by reducing the peak amplitude to the peak limit; and
   sending, to the loudspeaker, the third audio data.

6. The computer-implemented method of claim 1, further comprising:
   receiving, from a remote device, input audio data,
   wherein generating the first audio data further comprises delaying, prior to generating the second audio data, the input audio data by an audio delay time corresponding to a delay time caused by compressing the first dynamic range of the excursion data.

7. The computer-implemented method of claim 1, wherein the second audio data comprises first stereo audio data, the computer-implemented method further comprising:
   generating second stereo audio data;
   determining third gain data by compressing a third dynamic range of the excursion data;
   determining fourth gain data by compressing a fourth dynamic range of the temperature data;
   determining second smoothed gain data by smoothing the third gain data and the fourth gain data;
   generating third audio data by multiplying the second smoothed gain data and the second stereo audio data;
   generating analog audio data using the second audio data and the third audio data; and
   sending, to the loudspeaker, the analog audio data.

8. The computer-implemented method of claim 1, wherein:
   determining the excursion data further comprises predicting, using the second audio data and based on an excursion model, the excursion data; and
   determining the temperature data further comprises predicting, using the second audio data and based on a thermal model, the temperature data.

9. The computer-implemented method of claim 1, further comprising:
   determining that a volume level corresponding to the second audio data is greater than a maximum volume threshold;
   generating third audio data by reducing the volume level to the maximum volume threshold; and
   sending, to the loudspeaker, the third audio data.

10. A system, comprising:
    at least one processor; and
    at least one memory including instructions that, when executed by the at least one processor, to cause the system to:
    generate first audio data;
    determine excursion data corresponding to a position of a membrane of a loudspeaker;
    determine temperature data corresponding to a temperature of the loudspeaker;
    determine first gain data by compressing a first dynamic range of the excursion data;
    determine second gain data by compressing a second dynamic range of the temperature data, wherein the first gain data and the second gain data are determined in series;
    determine first smoothed gain data by adding the first gain data and the second gain data; and
    generate second audio data by multiplying the first smoothed gain data and the first audio data.

11. The system of claim 10, wherein the at least one memory further includes instructions that, when executed by the at least one processor, further cause the system to:
    generate third audio data;
    determine third gain data by compressing the second dynamic range of the temperature data;
    determine second smoothed gain data by smoothing the third gain data; and
    generate fourth audio data by multiplying the second smoothed gain data and the third audio data.

12. The system of claim 11, wherein the at least one memory further includes instructions that, when executed by the at least one processor, further cause the system to:
    generate fifth audio data by adding the second audio data and the fourth audio data;
    generate analog audio data using the fifth audio data; and
    send, to the loudspeaker, the analog audio data.

13. The system of claim 11, wherein the at least one memory further includes instructions that, when executed by the at least one processor, further cause the system to:
    determine a first frequency range of input audio data;
    determine a second frequency range of the input audio data,
    wherein the second frequency range is higher than the first frequency range.

14. The system of claim 10, wherein the at least one memory further includes instructions that, when executed by the at least one processor, further cause the system to:
    determine that a peak amplitude, represented in the second audio data, is greater than a peak limit corresponding to a maximum excursion of the membrane;
    generate third audio data by reducing the peak amplitude to the peak limit; and
    send, to the loudspeaker, the third audio data.

15. The system of claim 10, wherein the at least one memory further includes instructions that, when executed by the at least one processor, further cause the system to:
    receive, from a remote device, input audio data,
    wherein the instructions to generate the first audio data further include instructions that, when executed by the at least one processor, further cause the system to delay, prior to generating the second audio data, the input audio data by an audio delay time corresponding to a delay time caused by compressing the first dynamic range of the excursion data.

16. The system of claim 10, wherein the second audio data comprises first stereo audio data, and wherein the at least one memory further includes instructions that, when executed by the at least one processor, further cause the system to:
generate second stereo audio data;
determine third gain data by compressing a third dynamic range of the excursion data;
determine fourth gain data by compressing a fourth dynamic range of the temperature data;
determine second smoothed gain data by smoothing the third gain data and the fourth gain data;
generate third audio data by multiplying the second smoothed gain data and the second stereo audio data;
generate analog audio data using the second audio data and the third audio data; and
send, to the loudspeaker, the analog audio data.

17. The system of claim 10, wherein:
the instructions to determine the excursion data further include instructions that, when executed by the at least one processor, further cause the system to predict, using the second audio data and based on an excursion model, the excursion data; and
the instructions to determine the temperature data further include instructions that, when executed by the at least one processor, further cause the system to predict, using the second audio data and based on a thermal model, the temperature data.

18. The system of claim 10, wherein the at least one memory further includes instructions that, when executed by the at least one processor, further cause the system to:
determine that a volume level corresponding to the second audio data is greater than a maximum volume threshold;
generate third audio data by reducing the volume level to the maximum volume threshold; and
send, to the loudspeaker, the third audio data.

* * * * *